(12) United States Patent
Darfeuille

(10) Patent No.: US 10,819,358 B2
(45) Date of Patent: Oct. 27, 2020

(54) PHASE-FREQUENCY DETECTOR WITH FREQUENCY DOUBLING LOGIC

(71) Applicant: NXP B.V., Eindhoven (NL)

(72) Inventor: Sebastien Darfeuille, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/282,616

(22) Filed: Feb. 22, 2019

(65) Prior Publication Data

US 2020/0274540 A1 Aug. 27, 2020

(51) Int. Cl.
| | | |
|---|---|---|
| H03L 7/197 | (2006.01) | |
| H03L 7/06 | (2006.01) | |
| H03L 7/093 | (2006.01) | |
| H03L 7/07 | (2006.01) | |
| H03D 13/00 | (2006.01) | |

(52) U.S. Cl.
CPC ......... *H03L 7/1976* (2013.01); *H03D 13/004* (2013.01); *H03L 7/06* (2013.01); *H03L 7/07* (2013.01); *H03L 7/093* (2013.01)

(58) Field of Classification Search
CPC ......... H03L 7/1976; H03L 7/07; H03L 7/093; H03L 7/06
USPC ........................................ 327/156, 158, 161
See application file for complete search history.

(56) References Cited

U.S. PATENT DOCUMENTS

| | | | | |
|---|---|---|---|---|
| 7,078,977 B2* | 7/2006 | Maneatis | ............... | H03L 7/0893 |
| | | | | 327/156 |
| 7,535,272 B1* | 5/2009 | Kwong | ................... | H03L 7/081 |
| | | | | 327/156 |
| 7,626,437 B2 | 12/2009 | Naujokat | | |
| 2002/0018535 A1* | 2/2002 | Hairapetian | ............ | H03L 7/099 |
| | | | | 375/376 |

FOREIGN PATENT DOCUMENTS

WO   2016176205 A1   11/2016

OTHER PUBLICATIONS

A Dual Edge-Triggered Phase-Frequency Detector Architecture S.I. Ahmed, R.D. Mason Proceeding of the 2003 International Symposium in Circuits and Systems, ISCAS 2003, pp. 721-724.
Comparison Frequency Doubling and Charge Pump Matching Techniques for Dual-Band Sigma-Delta Fractional-N Frequency Synthesizer H. Huh, Y. Koo, K.-Y. Lee, Y. Ok, S. Lee, D. Kwon, J. Lee, J. Park, K. Lee, D.-K. Jeong, W. Kim IEEE Journal of Solid-State Circuits, vol. 40, issue.11, Nov. 2005, pp. 2228-2236.

(Continued)

*Primary Examiner* — John W Poos

(57) ABSTRACT

Aspects are directed to an arrangement of circuits configured to generate and correct an output signal relative to a reference signal in response to a direction indication signal. Included in the arrangement of circuits is a phase-frequency detection circuit having logic circuitry configured to respond to the reference signal and a feedback signal by generating and updating the direction indication signal as a function of the logic states of an internal clock signal having risen and fallen. In this context, the feedback signal is generated by a feedback circuit in response to the output signal.

19 Claims, 11 Drawing Sheets

(56) References Cited

OTHER PUBLICATIONS

A DLL with Dual Edge Triggered Phase Detector for Fast Lock and Low Jitter Clock Generator K. Ryu, D.-H. Jung, S.-O. Jung IEEE Transactions on Circuits and Systems I: Regular Papers, vol. 59, Issue 9, Sep. 2012, pp. 1860-1870.
Dual edge triggered phase detector for DLL and PLL applications Prasanna Kumar L., Ashok S., Arun Kumar N. International Journal of Engineering Research and Applications, issue 5, May 2015, pp. 12-15.
A 185fsrms-Integrated-Jitter and -245dB FOM PVT-Robust Ring-VCO-Based Injection-Locked Clock Multiplier with a Continuous Frequency-Tracking Loop Using a Replica-Delay Cell and a Dual-Edge Phase Detector S. Choi, S. Yoo, J. Choi IEEE ISSCC2016, pp. 194-196.
A fref/5 Bandwidth Type-II Charge-Pump Phase-Locked Loop With Dual-Edge Phase Comparison and Sympling Loop Filter K-S. Kim, K. Kim, C. Yoo IEEE Microwave and Wireless Components Letters, pending publication(2018).
A novel dual PFD charge-pump phase locked loop B.C. Sarkar, M. Nandi, R. Hati, A. Hati Indian Journal of Engineering & Material Sciences, vol. 4, Aug. 1997, pp. 129-133.

* cited by examiner

PHASE-FREQUENCY DETECTOR WITH FREQUENCY DOUBLING LOGIC

Aspects of various embodiments are directed to systems and methods for generating an output signal from a reference signal.

A variety of circuits such as phase locked loop (PLL) frequency synthesizers are commonly implemented for a variety of uses. Such circuits may operate to generate spectrally clean high-frequency clocks based on a lower-frequency reference clock. The ratio between the frequencies of the output and reference clocks can be integer or non-integer depending on the presence of a modulator to dynamically change the division ratio at every clock cycle. Non-integer division may be achieved over a number of clock cycles by successive integer divisions. The phase of the divided clock can be compared with the phase of the reference clock by a Phase-Frequency Detector (PFD), which generates an "up" or a "down" pulse having a duration that represents the phase error.

Certain circuits that contain a frequency synthesizer, such as a PLL are configured for operation over a certain range of reference frequencies. Frequency dividers or multipliers (e.g., reference frequency doublers) may be used on reference clock paths, such that the range of reference frequencies at the input of the frequency synthesizer is not too wide, to facilitate consistent PLL performance. However, adding circuitry can negatively impact amount of space needed for such circuitry and adversely affect design and production time, and can increase the complexity of operation. Further, logic added to accommodate such complexity can be difficult to properly validate and/or debug. Such approaches can also be challenging to implement, such as when a system reference clock is distributed as a differential signal and/or may struggle to make efficient use of such a signal.

SUMMARY

Various example embodiments are directed to addressing issues such as those noted above and/or others which may become apparent from the following disclosure. Certain aspects are directed to a circuit or arrangement thereof for generating output signals from reference signals. In various implementations, a PFD is used in analog frequency synthesizers, and operates to provide a multiplication of its reference frequency. Such approaches can be utilized to mitigate or avoid the need to place an additional circuit in front of a PFD to effect multiplication.

In certain example embodiments, aspects of the present disclosure involve an arrangement of circuits including PFD circuitry that can be configured to double the frequency of the reference signal received using logic circuitry included therein. A direction indication signal generated by the PFD circuit can be used to correct any difference between the reference signal and a feedback signal once they have been compared.

In a specific example embodiment, aspects of the present disclosure are directed to an apparatus having a correction and signal-drive circuit, a PFD circuit and a feedback circuit. The correction and signal-drive circuit is configured to generate and correct an output signal, in terms of phase and/or frequency, relative to a reference signal having complementary differential signal components and in response to a direction indication signal. The output signal has logic states that alternate in response to the reference signal for characterizing the frequency and phase. The PFD circuit includes logic circuitry configured to respond to the reference signal and to a feedback signal by generating and updating a direction indication signal as a function of each of the logic states of an internal clock signal having risen and having fallen. The feedback circuit is configured to generate the feedback signal in response to the output signal.

In other specific example embodiments, aspects of the present disclosure are directed to a method for correcting the output signal, in response to a direction indication signal, in terms of at least one of phase or frequency relative to a reference signal having complementary differential signal components. The output signal has logic states that alternate in response to the reference signal for characterizing frequency and phase. Logic circuitry that is configured as part of a PFD circuit is utilized to respond to the reference signal and to a feedback signal, by generating and updating the direction indication signal as a function of each of the logic states of an internal clock signal having risen and having fallen. The output signal is coupled to provide the feedback signal, via the feedback circuit.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
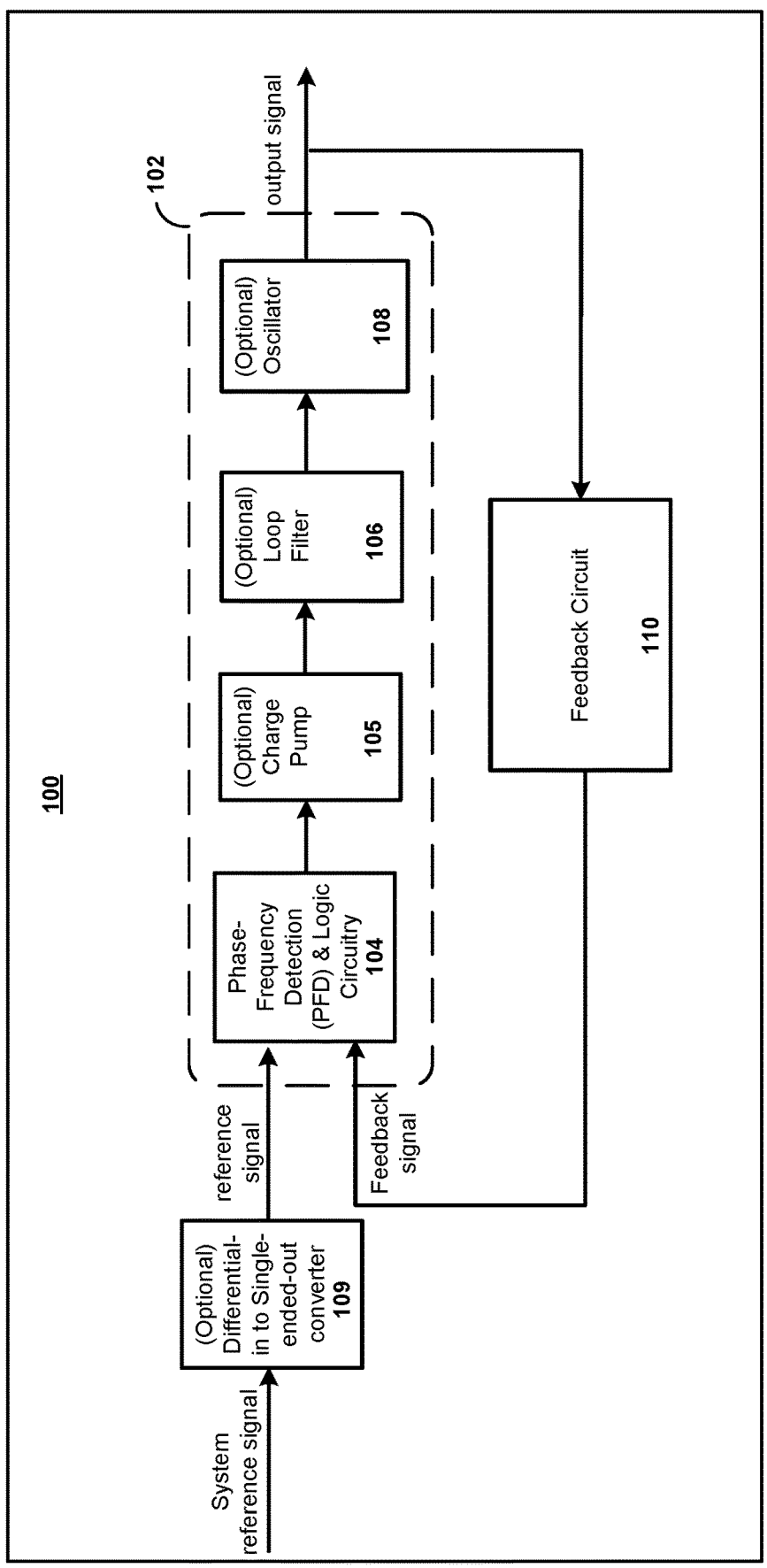
FIG. 1 is a system-level diagram illustrating an example of an arrangement of circuits that can generate output signals from a reference signal, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods, as may be related to circuitry or an arrangement of circuits for generating an output signal from a reference signal. In some embodiments, a phase-frequency detection (PFD) circuit is configured to double the frequency of a reference signal, as well as generate and/or update a direction indication signal used to reduce the error between the reference signal and a feedback signal. While not necessarily so limited, various aspects may be appreciated through the following discussion of non-limiting examples which use exemplary contexts.

In the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Specific example embodiments are directed to a circuit or an arrangement thereof for the detection and/or the correction of a difference, in terms of phase and/or frequency, between an output signal and a reference signal having complementary differential signal components. A correction and signal-drive circuit is configured to generate and correct an output signal, in terms of at least frequency or phase, relative to a reference signal having complementary differential signal components. The output signal has logic states, used in the process of characterizing frequency and phase, which alternate in response to the reference signal. A PFD circuit includes logic circuitry configured to respond to the signal and a feedback signal by generating and updating a direction indication signal as a function of each of the logic states of an internal clock signal having risen and fallen. A feedback circuit in the feedback loop is configured to generate the feedback signal in response to the output signal.

In various implementations, the output and reference signals have respective frequencies that relate to each other by a ratio that may be an integer or non-integer value. The ratio between the output signal and the reference signal depends on the frequency division ratio of the divider circuit, which can be programmable, in the feedback loop of the arrangement of circuits. Non-integer ratios can be realized over a number of divisions performed over a number of successive clock cycles by changing the division ratio between divisions.

Additional aspects of the present disclosure are directed to an arrangement of signal conversion circuitry, including a feedback circuit (e.g., a programmable divider, or feedback divider circuit), that can be configured to generate the complementary differential components of the reference signal. A PFD circuit included in the arrangement can be configured to update a direction indication signal in response to each edge of an internal clock signal, which either falls or rises. The PFD circuit includes logic circuitry that may include a plurality of flip-flop circuits. The flip-flop circuits can be implemented as a plurality of combinatorial logic blocks, as plain D flip-flops, and/or by using discrete transistors.

In additional embodiments, the signal-drive circuit, the PFD circuit, and the feedback circuit are collectively configured as a frequency synthesizer. Additionally and/or alternatively, the signal-drive circuit, the PFD circuit, and the feedback circuit are configured as part of an analog PLL or a Delay Locked Loop (DLL) circuit. While in any of these configurations, the correction and signal-drive circuit and the PFD circuit are collectively configured to provide phase detection and correction by detecting whether the reference signal lags or leads the output signal and, in response, providing a direction indication signal. The direction indication signal can be thought of as either an "up" or "down" pulse representing whether the reference signal is late (lags) or is early (leads) with respect to the feedback signal. The duration of the pulse corresponds to the error detected between the feedback and reference signals.

Additional aspects are directed to a method for correcting an output signal in terms of at least one of phase or frequency relative to a reference signal having complementary differential signal components. The output signal can have logic states that alternate in response to the reference signal for characterizing the frequency and phase. Logic circuitry, which may be implemented as part of a PFD circuit, responds to the reference signal and to a feedback signal by generating and updating the direction indication signal as a function of each of the logic states of an internal clock signal having risen and fallen. A feedback circuit (e.g., a divider circuit) can be used to couple the output signal to provide a feedback signal.

Logic circuitry utilized in the above-described method can include a plurality of flip-flop circuits that can be configured to trigger on or in response to one of a rising/falling edge of the internal clock signal. In some implementations, these functions are achieved without using another separate circuit configured to provide frequency doubling for the reference signal. PFD circuitry, in accordance with the above-mentioned method, can be configured to respond to each of the logic states of the internal clock signal having risen and having fallen to provide a frequency doubling for the reference signal.

Depicted in FIG. 1 is an arrangement of circuits 100 configured to generate an output signal from a reference signal in accordance with aspects of the present disclosure. Included in the arrangement of circuits is a correction and signal-drive circuit 102, which includes phase-frequency detection (PFD) and logic circuitry 104. The output signal is processed by feedback circuit 110 before being fed back to PFD and logic circuitry 104. Optionally, charge pump 105, loop filter 106 and oscillator 108 may be included in the correction and signal-drive circuit 102 to further process the signal output by the PFD and logic circuitry 104. In some embodiments, a differential-into single-ended out converter 108 is utilized to generate the reference signal from a system reference signal.

Figure 2:
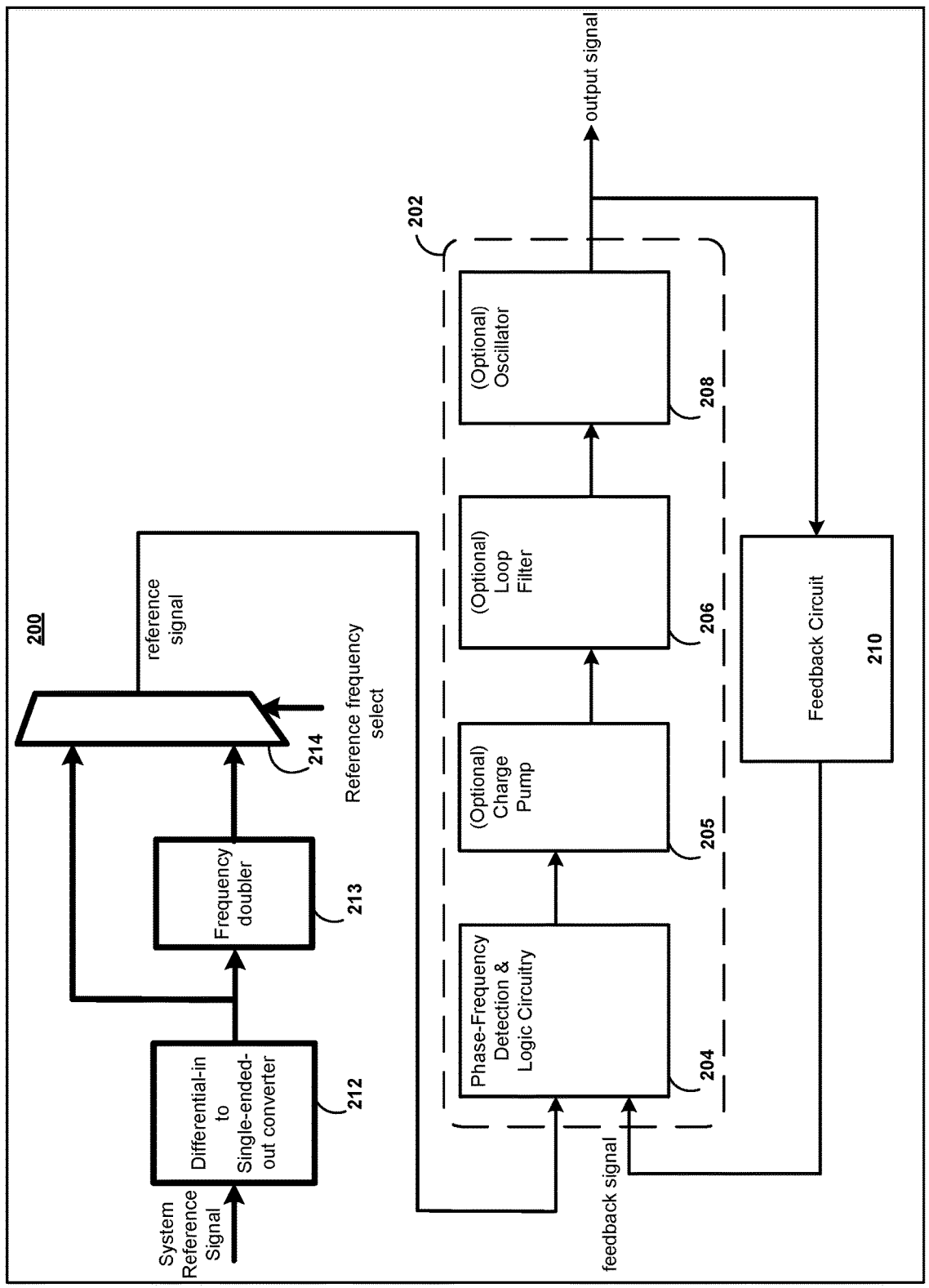
FIG. 2 is a system-level diagram illustrating another example of an arrangement of circuits that can generate output signals from a reference signal, in accordance with the present disclosure.

FIG. 2 depicts an arrangement of circuits 200, configured to generate an output signal from a reference signal. The arrangement of circuits 200 may be implemented in a manner consistent with (and expounding upon) the arrangement presented in FIG. 1. A correction and signal-drive circuit 202 may include PFD and logic circuitry that receives and processes a reference signal with a feedback signal for generating the output signal. Optionally, the correction and signal-drive circuit 202 can further include a charge pump 205, loop filter 206 and/or an oscillator circuit 208. The arrangement of circuits 200 may further include a differential to single-ended converter 212 that converts a system reference signal into a single-ended signal that is doubled by frequency doubler 213 and processed at a reference frequency select circuit 214 to provide a reference signal to the PFD and logic circuitry 204. Once the output signal is generated by correction and signal-drive circuit 202, it is input to feedback circuit 210, producing a feedback signal. The feedback signal is input to the PFD and logic circuitry 204 where it is compared to the reference signal to detect error, in terms of phase, between the two signals in order to generate the direction indication signal.

Figure 3:
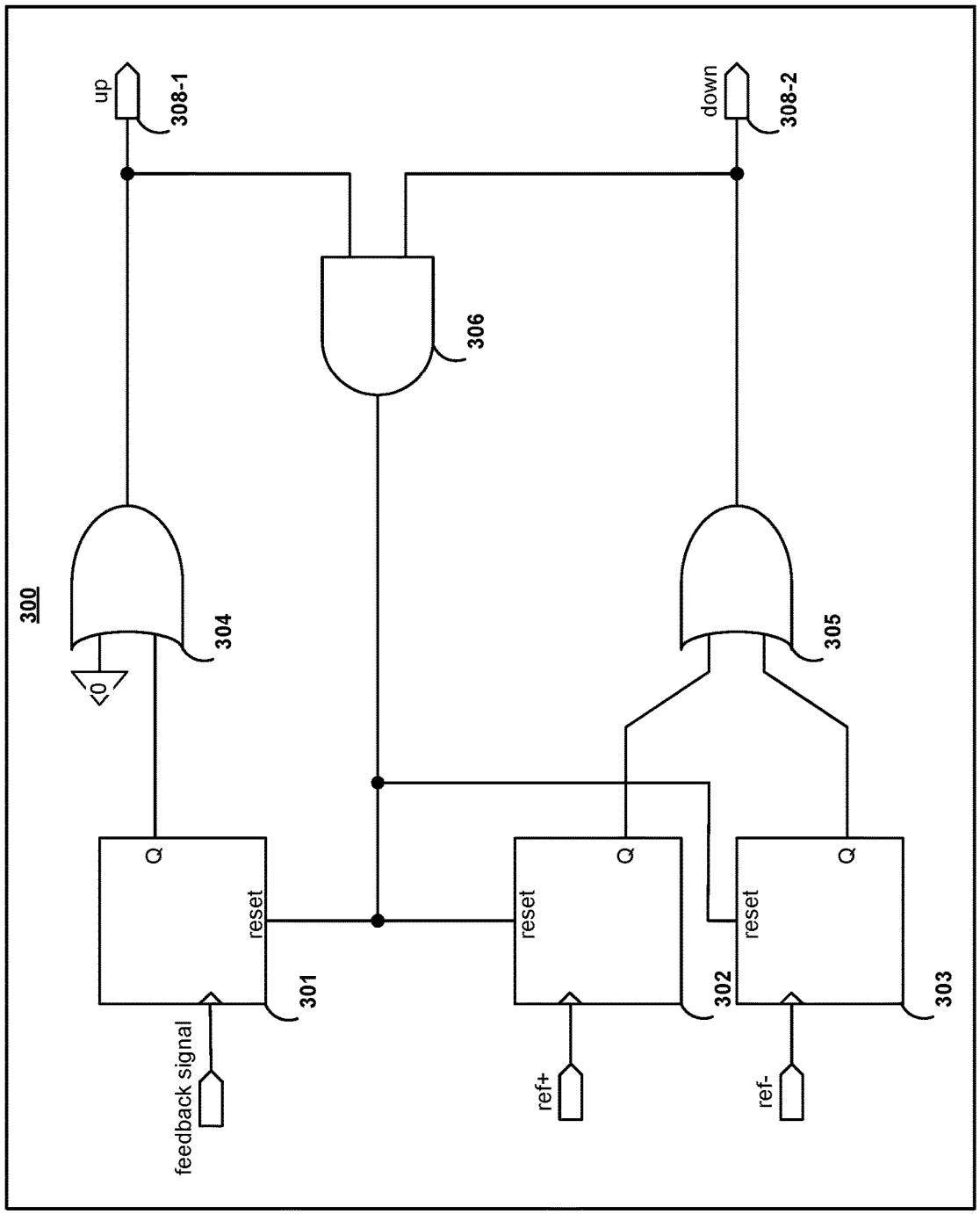
FIG. 3 is a circuit-level diagram illustrating an example of phase-frequency detection circuit, in accordance with the present disclosure.

In accordance with the above-mentioned embodiments, the phase-frequency detection circuit 300 depicted in FIG. 3 processes a feedback signal and the complementary differential components of a reference signal, ref+ and ref− to generate a direction indication signal 308-1, 308-2. The feedback signal is input to logic circuit (flip-flop) 301. The positive component of the reference signal, ref+, is input to logic circuit (flip-flop) 302, while the negative component of the reference signal, ref−, is input to logic circuit (flip-flop) 303. The flip-flops used in the PFD circuit can have clock, reset, and D inputs, and an output Q. The D input can be set to a fixed logic state (e.g., a logic high level). Additional logic circuits 304, 305, and 306 may be used in the production/selection of the direction indication signal 308-1, 308-2. For instance, logic circuit 304 may have an output logic state equal to its input as driven by 301, which provides similar propagation delay on the PFD.

After receiving the feedback signal as an input, flip-flop 301 outputs a signal that undergoes a logic OR operation with a constant 0 value at OR gate 304, resulting in the up direction indication signal 308-1. The up direction indication signal 308-1 is available as an output of the PFD circuit, and as an input to AND gate 306. The signals output by flip-flops 302 and 303 undergo a logic OR operation at OR gate 305, resulting in the down direction indication signal 308-2. The down direction indication signal 308-2 is available as an output of the PFD circuit, and as an input to AND gate 306. The signal resulting from the logic AND operation executed by AND gate 306 is distributed to the reset pin of flip-flops 301, 302, and 303.

In certain embodiments, a delay cell is placed between the output of the AND gate 306 and the input RESET pins of flip-flops 301, 302 and 302. This is useful, for example, to mitigate or prevent the so-called "dead-zone" problem in case the output of the PFD is connected to a charge pump circuit. Further, such an approach can also be carried out with the embodiments characterized in FIGS. 4, 6a and 6b and discussed below.

Figure 4:
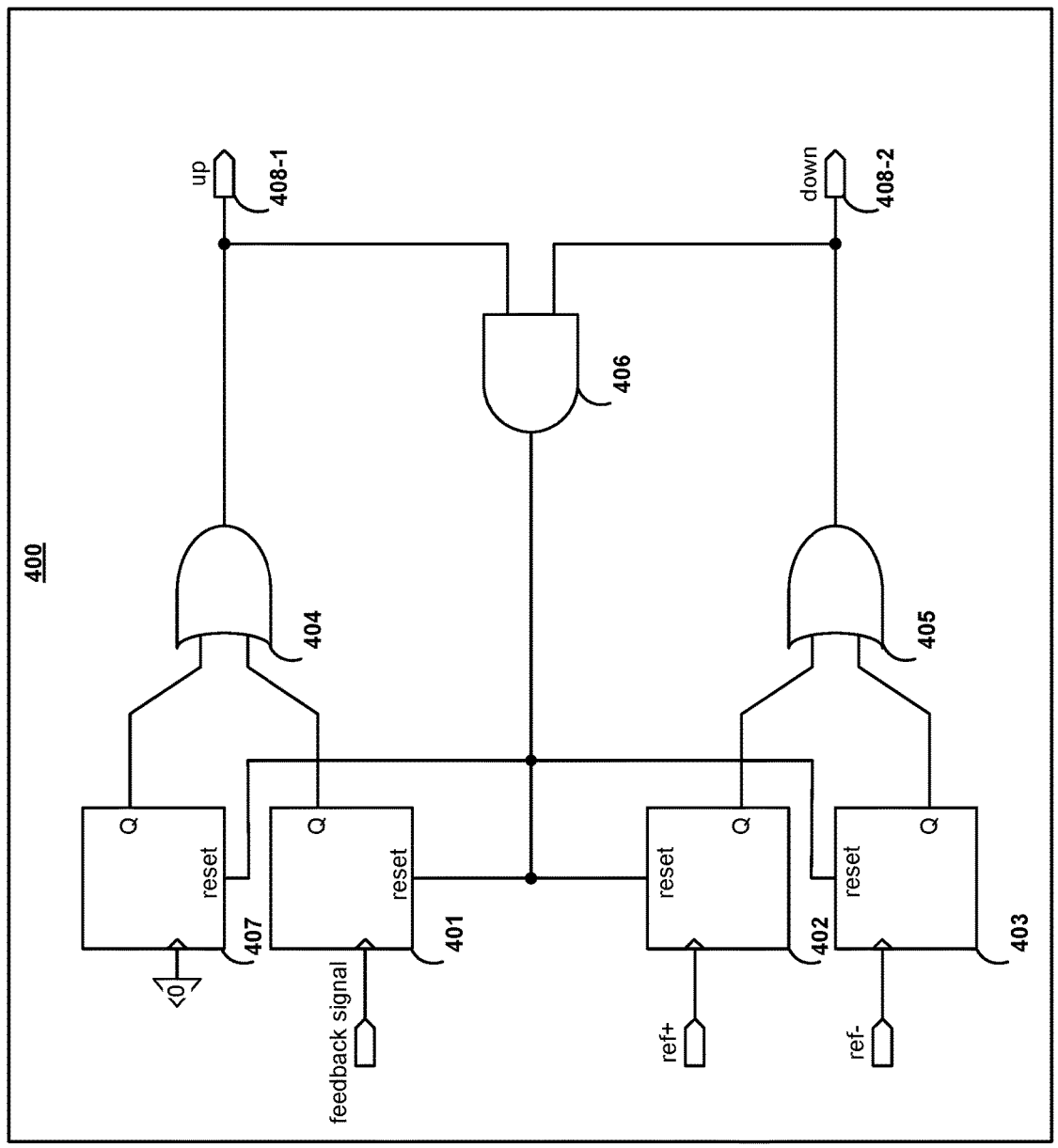
FIG. 4 is a circuit-level diagram depicting another example of a phase-frequency detection circuit, in accordance with the present disclosure.

FIG. 4 illustrates another PFD circuit 400 exemplifying aspects of the present disclosure. A feedback signal is input to flip-flop 401. The positive component of a differential reference signal, ref+, is stored in flip-flop 402 and the negative component of the differential reference signal, ref−, is stored in flip-flop 403. Additional logic circuits 404, 405, 406, and 407 are used in the production/selection of direction indication signal 408-1, 408-2.

After receiving the feedback signal as an input, flip-flop 401 outputs a signal that undergoes a logic OR operation at OR gate 404 with the signal output by flip-flop 407, which has as its input a constant 0 value. The result of the OR operation executed by OR gate 404 is an up direction indication signal 408-1, which is available as an output of the PFD circuit, and as an input to AND gate 406. The positive component of the differential reference signal, ref+, stored in flip-flop 402 and the negative component of the differential reference signal, ref−, stored in flip-flop 403 undergo a logic OR operation at OR gate 405. The result of the OR operation executed at OR gate 405 is the down direction indication signal 408-2. The down direction indication signal 408-2 is available as an output of the PFD circuit, and as an input to AND gate 406. The signal resulting from the logic AND operation executed by AND gate 406 is distributed to the reset pin of flip-flops 401, 402, 403, and 407.

Figure 5:
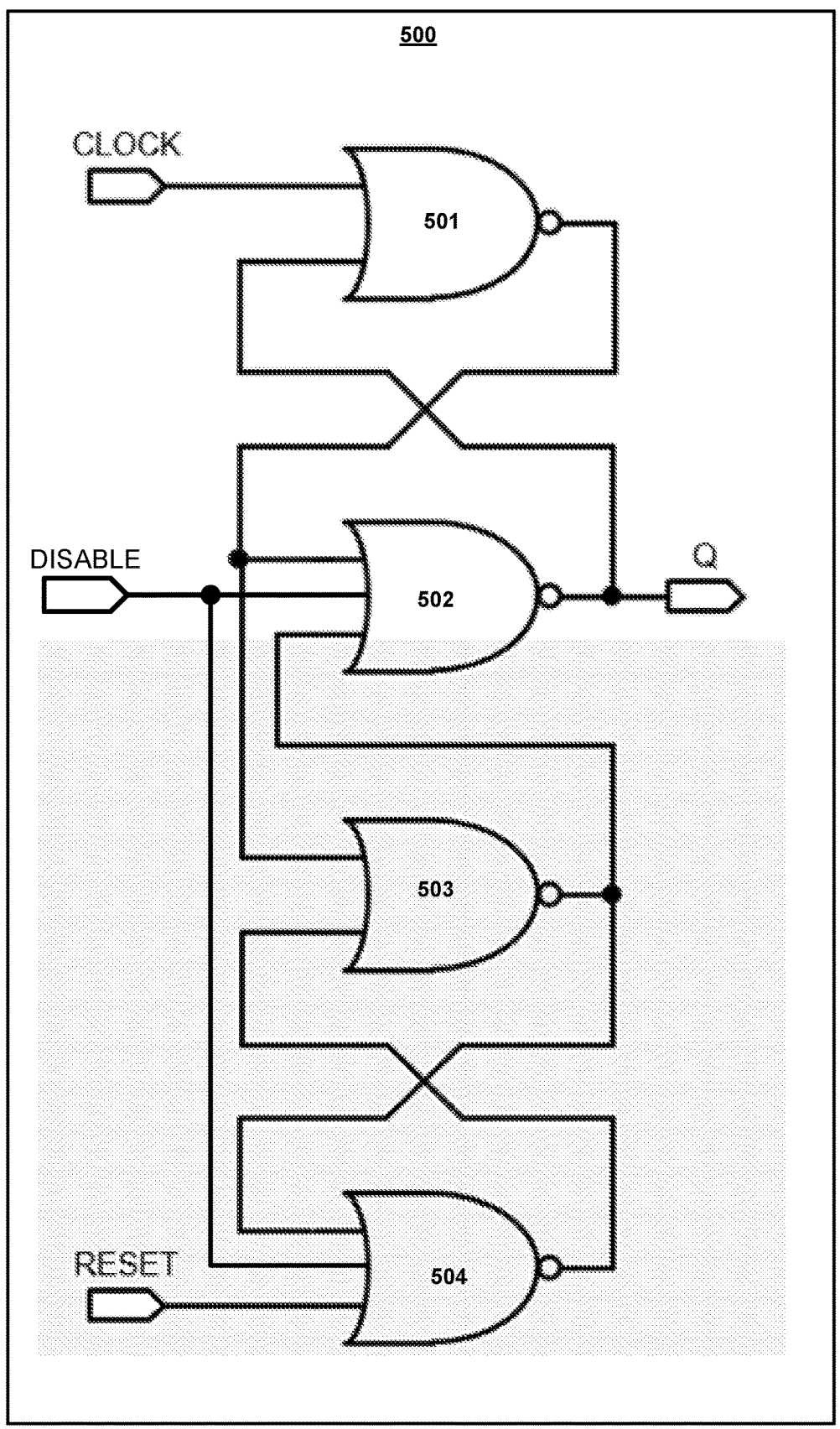
FIG. 5 illustrates a circuit-level diagram of a flip-flop suitable for use in a PFD, in accordance with the present disclosure.

Illustrated in FIG. 5 is a design for a flip-flop circuit 500 in which a first NOR gate 501 receives as inputs a clock signal and the output of a second NOR gate 502, and outputs a signal that is input to the second NOR gate 502 and a third NOR gate 503. The second NOR gate 502 has input the output signals of the first NOR gate 501 and the third NOR gate 503 and outputs signal Q, which is input to the first NOR gate 501. Signal Q is the output signal of flip-flop 500. The third NOR gate 503 receives as inputs the signals output by the first NOR gate 501 and a fourth NOR gate 504 and outputs a signal that is input to the second and fourth NOR gates 502, 504. The fourth NOR gate 504 receives as inputs the output of the third NOR gate 503 and a reset signal, and outputs a signal that is input to the third NOR gate 503.

A flip-flop such as the one depicted in FIG. 5 will have output signal Q go high upon a rising edge of the clock signal being detected by NOR gate 501 and will remain in this state until a rising edge of the reset signal is detected at NOR gate 504. Once NOR gate 504 detects a rising edge of the reset signal, the output signal Q is set to logic low and will remain in this state until the next rising edge of the clock signal is detected by NOR gate 501. A disable input is selectively provided for the second NOR gate 502 and fourth NOR gate 504 (e.g., as may be implemented with FIGS. 6a and 6b). For instance, the circuitry shown in FIG. 5 can be utilized in a PFD characterized herein, where the reference frequency is doubled, such that the PFD operates at twice the actual reference frequency or at the actual reference frequency, depending upon the disable input.

Figure 6A:
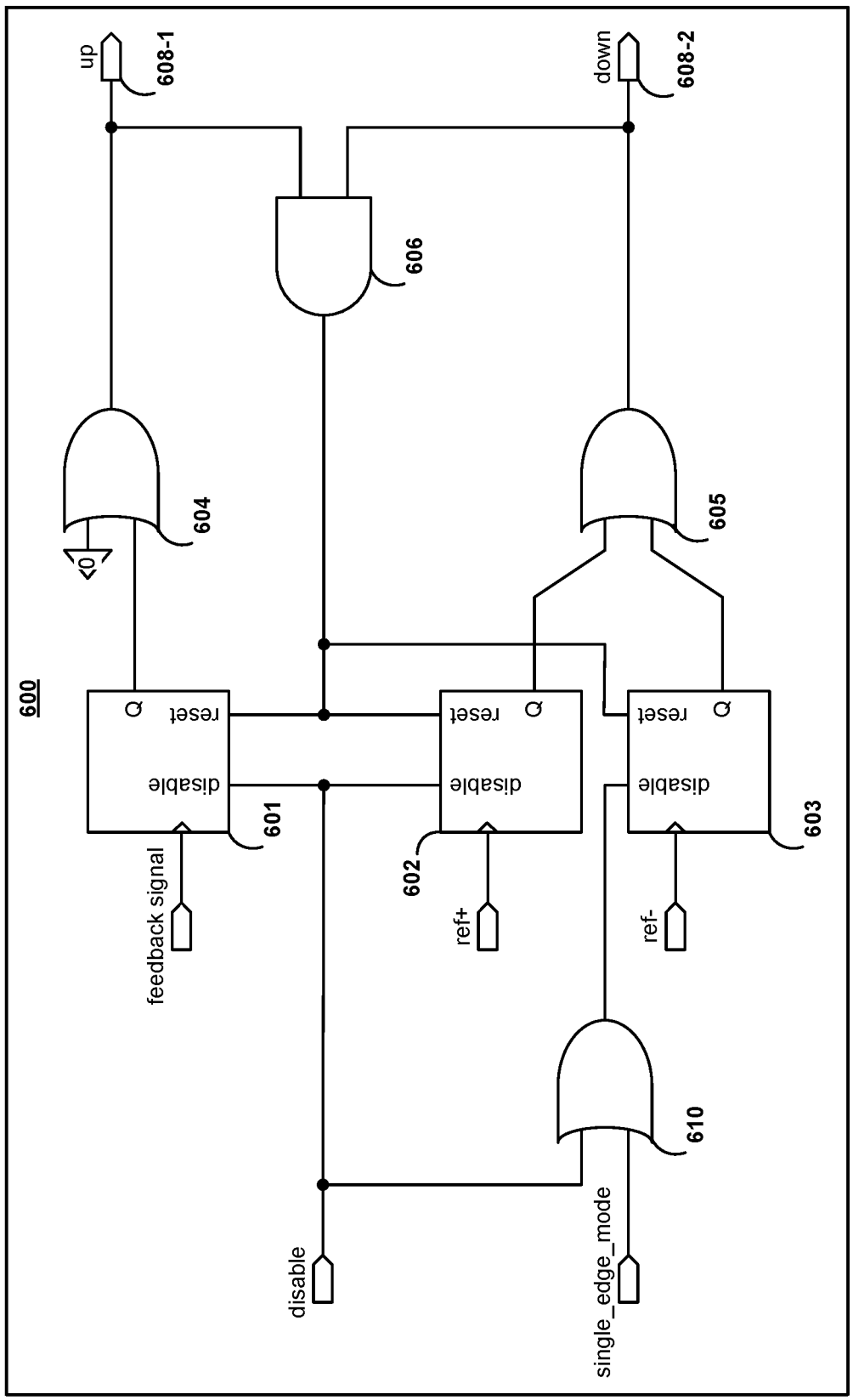
FIGS. 6a and 6b are circuit-level diagrams illustrating additional examples of phase-frequency detection circuitry, in accordance with the present disclosure.

In accordance with the above-mentioned embodiments, phase-frequency detection circuit 600 depicted in FIG. 6a receives as inputs a feedback signal and the complementary differential components of a reference signal, ref+ and ref−. The feedback signal is input to flip-flop 601. The positive component of the reference signal, ref+, is input to flip-flop 602, while the negative component of the reference signal, ref−, is input to flip-flop 603. Additional logic circuits 604, 605, and 606 are used in the production/selection of direction indication signal 608-1, 608-2.

After receiving the feedback signal as an input, flip-flop 601 outputs a signal that undergoes a logic OR operation with a constant 0 value by OR gate 604, resulting in the up direction indication signal 608-1. The up direction indication signal 608-1 is available as an output of the PFD circuit, and as an input to AND gate 606. The positive component of the differential reference signal, ref+, stored in flip-flop 602 and the negative component of the differential reference signal, ref−, stored in flip-flop 603 undergo a logic OR operation at OR gate 605, resulting in the down direction indication signal 608-2. The down direction indication signal 608-2 is available as an output of the PFD circuit, and as an input to AND gate 606. The signal resulting from the logic AND operation executed by AND gate 606 is distributed to the reset pin of flip-flops 601, 602, and 603.

Also depicted in FIG. 6a is OR gate 610, receiving as inputs a disable signal, which is distributed directly to the disable pin of flip-flops 601 and 602, and a single_edge_mode signal. The result of the logic OR operation between the disable and single_edge_mode signals executed at OR gate 610 is sent to the disable pin of flip-flop 603. When the disable signal and single_edge_mode signals are set to a logic low, flip-flops 601, 602, and 603 behave conventionally, which is to say the state of signals output by flip-flops 601, 602, and 603 is set to logic high when a rising edge of a clock signal is detected. The output of flip-flops 601, 602, and 603 will remain high until a rising edge of a reset signal is detected. Upon detecting a rising edge of a reset signal, flip-flops 601, 602, and 603 set the state of their output signals to logic low until the next rising edge of the clock signal is detected by the flip-flops. When the disable signal is set low and the single_edge_node signal is set high, flip-flops 601 and 602 behave conventionally whereas flip-flop 603 has its output preset to a logic low level and therefore becomes transparent for the PFD. As only the rising edges of ref+ are then being processed the PFD behaves as in a conventional design operating at the frequency of the reference signal. Setting the disable signal to high will cause flip-flops 601, 602, and 603 to become disabled (e.g., setting their outputs low), thus turning the PFD into an off mode. Both UP and DOWN outputs are preset to a logic low level and the circuit will not consume any current, under conditions such as those wherein the input reference of feedback signals are toggling.

Figure 6B:
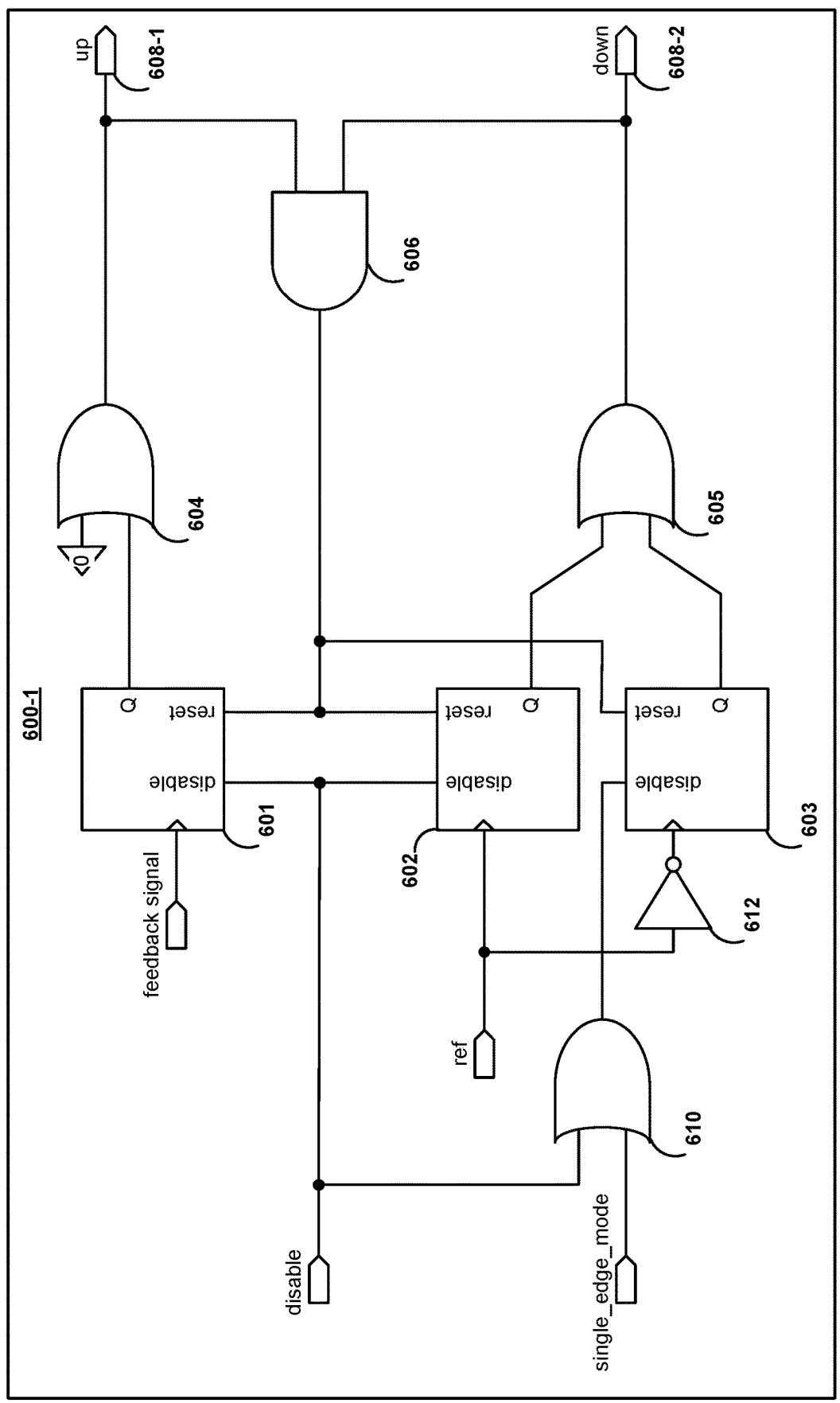

Phase-frequency detection circuit 600-1 depicted in FIG. 6b processes a feedback signal and a reference signal, ref. The reference signal is input to flip-flop 602 directly, and to flip-flop 603 after passing through inverter 612. Inverter 612 may be included upstream of flip-flop 603 in the path of the reference signal to enable the PFD circuit 600-1 to accommodate single-ended reference signals. The resulting circuit may thus behave as if the reference signal had a frequency twice the actual signal, as facilitated by operating on both "sides" of the differential reference signal.

After receiving the feedback signal as an input, flip-flop 601 outputs a signal that undergoes a logic OR operation with a constant 0 value by OR gate 604, resulting in the up direction indication signal 608-1. The up direction indication signal 608-1 is available as an output of the PFD circuit, and as an input to AND gate 606. The component of the reference signal stored in flip-flop 602 and the component of the reference signal stored in flip-flop 603 undergo a logic OR operation at OR gate 605, resulting in the down direction indication signal 608-2. The down direction indication signal 608-2 is available as an output of the PFD circuit, and as an input to AND gate 606. The signal resulting from the logic AND operation executed by AND gate 606 is distributed to the reset pin of flip-flops 601, 602, and 603.

Also depicted in FIG. 6b is OR gate 610, receiving as inputs a disable signal, which is distributed directly to the disable pin of flip-flops 601 and 602, and a single_edge_mode signal. The result of the logic OR operation between the disable and single_edge_mode signals executed at OR gate 610 is presented to the disable pin of flip-flop 603. When the disable signal has its state set to logic low, flip-flops 601, 602, and 603 behave conventionally. The state of the signals output by flip-flops 601, 602, and 603 is set high when a rising edge of a clock signal is detected, and will remain high until the rising edge of a reset signal is detected. Upon detecting a rising edge of the reset signal, flip-flops 601, 602, and 603 set the state of their output signals to low until the next rising edge of the clock signal is detected. When the disable signal is set low and the single_edge_node signal is set high, flip-flops 601, 602 and 603 may behave as characterized above with FIG. 6a under such conditions. When setting the disable signal high, flip-flops 601, 602, and 603 become disabled, having their outputs set low (e.g., turning the PFD into an off mode as also characterized above with FIG. 6b).

When either PFD circuit 600 or 600-1 have the state of the single_edge_mode signal set low, flip-flops 602 and 603 are able to accept a reference signal having differential signal components, effectively doubling the frequency of the reference signal.

Figure 7A:
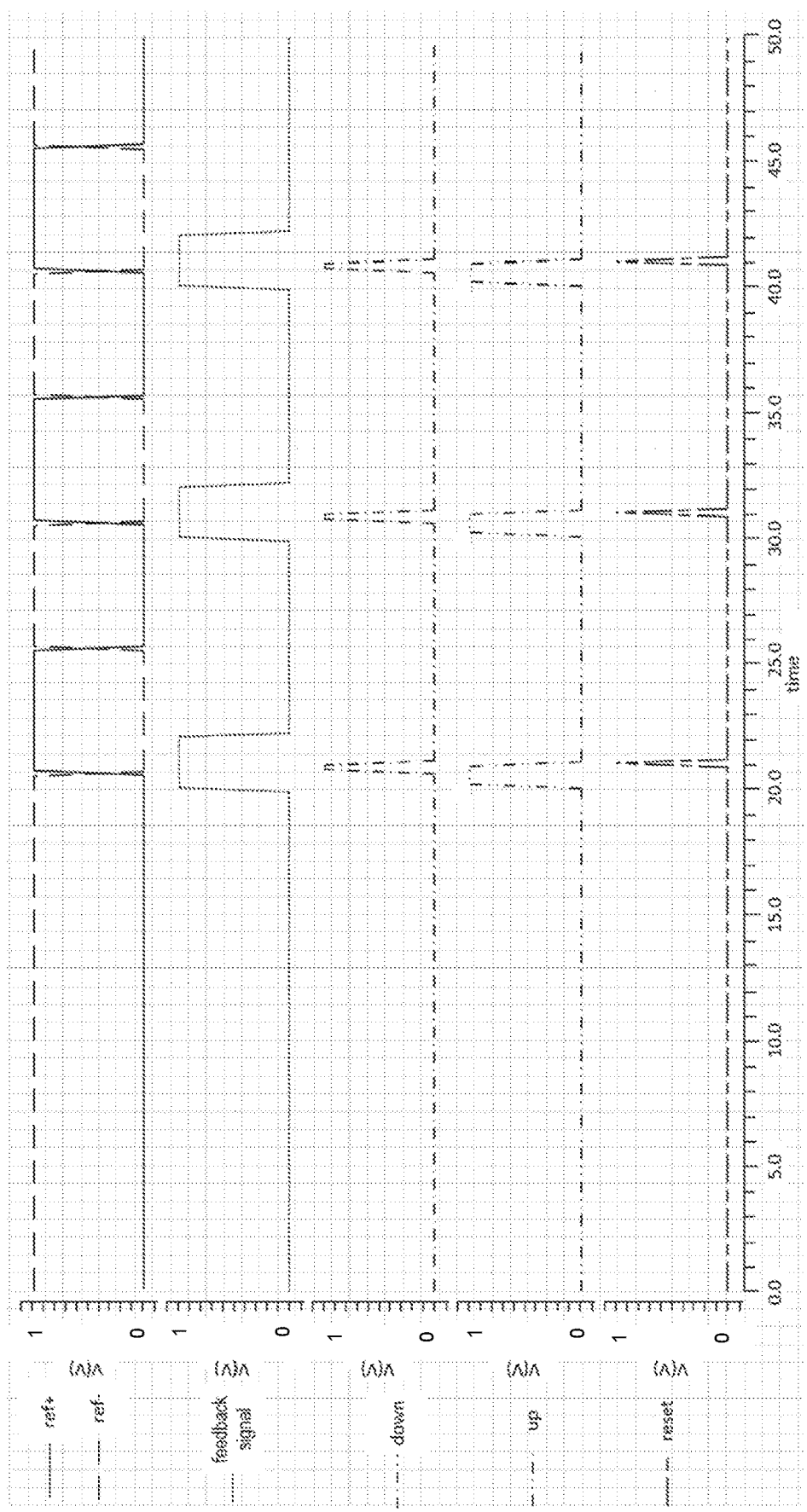
FIGS. 7a-7d are examples of timing diagrams of a PFD circuit, in accordance with the present disclosure.
Figure 7B:
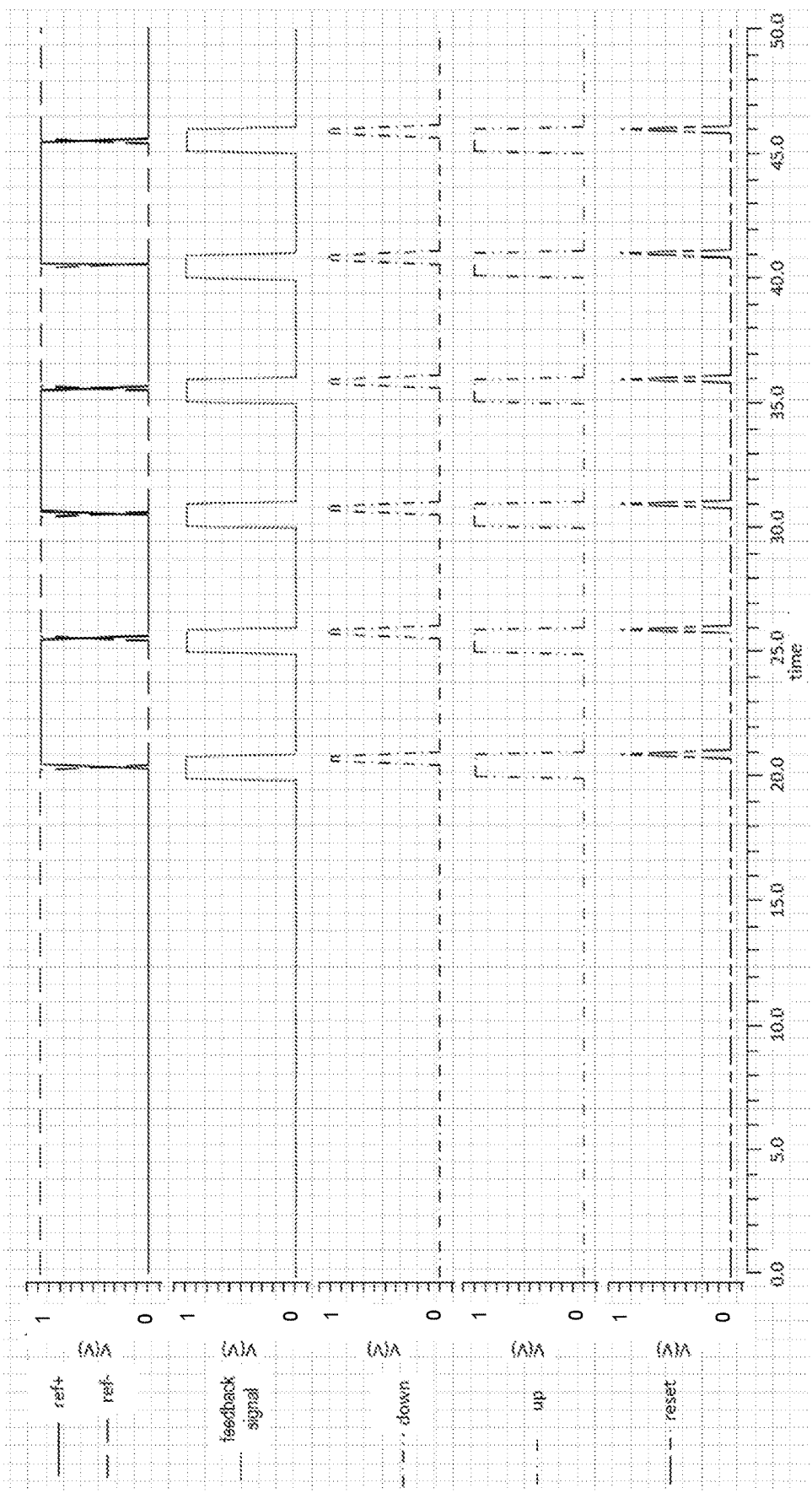
Figure 7C:
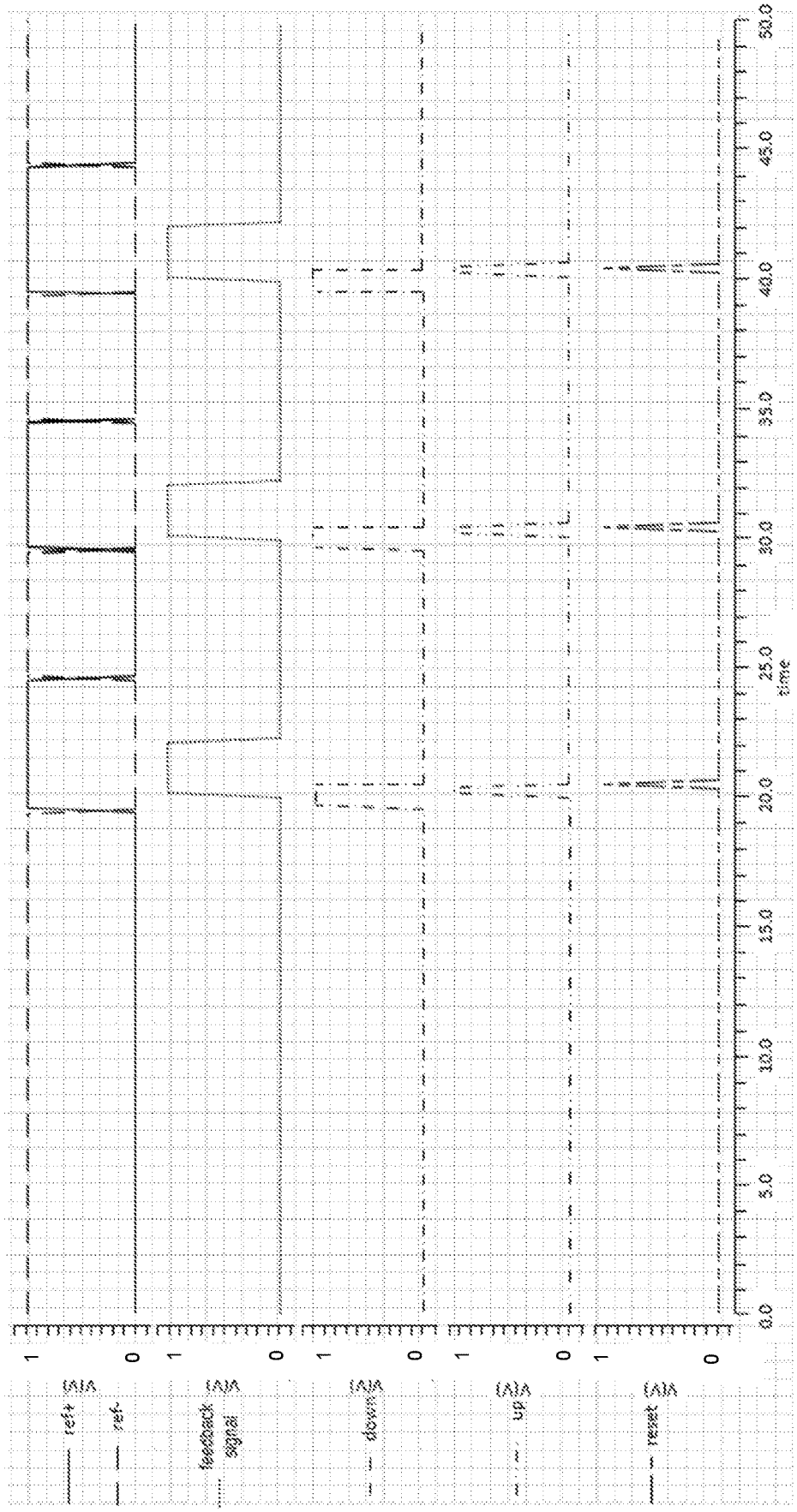
Figure 7D:
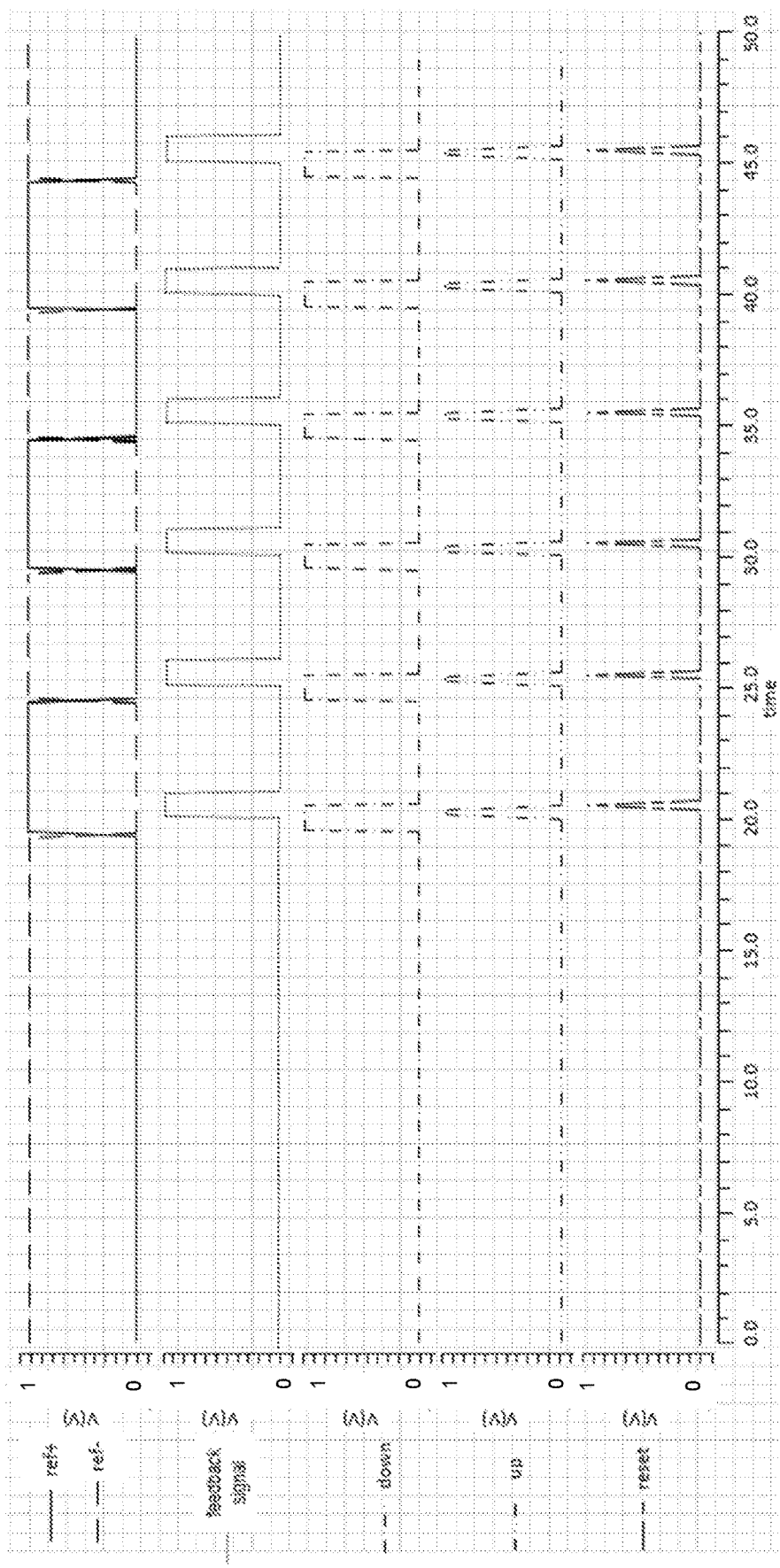

Depicted in FIGS. 7a, 7b, 7c, and 7d are examples of timing diagrams representing different states of operation of a PFD circuit, in accordance with the present disclosure. Such a PFD circuit may be operated in accordance with one or more embodiments characterized above. Shown in FIG. 7a is when a PFD circuit is not configured to operate as a reference frequency doubler, with the feedback signal leading the reference signal. The instance depicted in FIG. 7b is one in which the PFD circuit is operating as a reference frequency doubler, with the feedback signal leading the reference signal. FIG. 7c illustrates an instance in which the PFD circuit is not configured to act as a reference frequency doubler, with the reference signal leading the feedback signal. Finally, FIG. 7d depicts an instance in which the PFD circuit is configured to act as a reference frequency doubler, with the reference signal leading the feedback signal.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, arrangement of circuits, arrangement, and/or other circuit-type depictions (e.g., reference numerals 100 and 200 of FIG. 1 and FIG. 2 depict an arrangement of circuits as described herein). Such circuits or circuitry are used together with other elements to exemplify how certain embodiments may be carried out in the form or structures, steps, functions, operations, activities, etc. As another example, where the Specification may make reference to a "first [type of structure]", a "second [type of structure]", etc., where the [type of structure] might be replaced with terms such as ["circuit", "circuitry", "arrangement of circuits", "arrangement(s)", and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus comprising:
a correction and signal-drive circuit configured and arranged to generate and correct an output signal, in terms of at least one of phase and frequency, relative to a reference signal having complementary differential signal components and in response to a direction indication signal, wherein the output signal has logic states which alternate in response to the reference signal for characterizing the frequency and phase;
a phase-frequency detection circuit including logic circuitry configured and arranged to respond to the reference signal and to a feedback signal by generating and updating the direction indication signal as a function of each of the logic states of an internal clock signal having risen and having fallen
a feedback circuit configured and arranged to generate the feedback signal in response to the output signal; and
a signal conversion circuit configured and arranged to generate the complementary differential signal components of the reference signal, wherein the phase-frequency detection circuitry generates and updates the direction indication signal in response to rising or falling edges of each of the differential signal components, and wherein the feedback circuit includes a programmable divider.

2. The apparatus of claim 1, wherein the phase-frequency detection circuit is further configured and arranged to:
generate the internal clock at a frequency that is doubled relative to a frequency of the reference signal based on rising or falling edges of the differential signal components that occur during each period of the reference signal, and
update the direction indication signal in response to each edge of the internal clock signal which either falls or rises.

3. The apparatus of claim 1, wherein the logic circuitry includes a plurality of flip-flop circuits configured to trigger on or in response to one of: a rising edge or a falling edge of the internal clock signal, and wherein the phase-frequency detection circuit is configured to generate and update the direction indication signal based on the triggering of the flip-flop circuits, the triggering providing a frequency that is doubled relative to a frequency of the reference signal.

4. The apparatus of claim 1, wherein the logic circuitry includes a plurality of flip-flop circuits, and wherein each of the flip-flop circuits is implemented as a plurality of combinatorial logic blocks.

5. The apparatus of claim 1, wherein the logic circuitry includes a plurality of flip-flop circuits, and wherein each of the flip-flop circuits is implemented as a D flip-flop.

6. The apparatus of claim 1, wherein the logic circuitry includes a plurality of flip-flop circuits, each of the flip-flop circuits being implemented using: discrete CMOS-based transistors, bipolar transistors and resistors, or a combination of CMOS-based transistors and bipolar transistors and resistors.

7. The apparatus of claim 1, wherein the correction and signal-drive circuit, the phase-frequency detection circuit and the feedback circuit are collectively configured and arranged as a frequency synthesizer.

8. The apparatus of claim 1, wherein the correction and signal-drive circuit and the phase-frequency detection circuit are collectively configured and arranged to provide phase detection and correction by detecting whether the reference signal lags or leads the output signal and, in response, by providing the direction indication signal.

9. The apparatus of claim 1, wherein the correction and signal-drive circuit, the phase-frequency detection circuit and the feedback circuit are collectively configured and arranged as part of an analog frequency synthesizer such as a Phase Locked Loop circuit or Delay Locked Loop circuit.

10. The apparatus of claim 1, wherein the output signal and reference signal have respective frequencies which relate to each other by an integer ratio having a value that depends on the frequency division ratio of a programmable divider included in the feedback circuit.

11. The apparatus of claim 1, wherein the output signal and reference signal have respective frequencies that relate to each other by an integer ratio having a value that depends on the frequency division ratio of a feedback divider circuit.

12. The apparatus of claim 11, wherein the feedback circuit includes the feedback divider circuit and is configured and arranged with the correction and signal-drive circuit and the phase-frequency detection circuit as part of a PLL that controls the frequency ratio between the reference signal and the output signal.

13. The apparatus of claim 1, wherein the output signal and reference signal have respective frequencies that relate to each other by a non-integer ratio having a value that depends on the frequency division ratio of a feedback divider in the feedback circuit.

14. An apparatus comprising:
a correction and signal-drive circuit configured and arranged to generate and correct an output signal, in terms of at least one of phase and frequency, relative to a reference signal having complementary differential signal components and in response to a direction indication signal, wherein the output signal has logic states which alternate in response to the reference signal for characterizing the frequency and phase;
a phase-frequency detection circuit including logic circuitry configured and arranged to respond to the reference signal and to a feedback signal by generating and updating the direction indication signal as a function of each of the logic states of an internal clock signal having risen and having fallen
a feedback circuit configured and arranged to generate the feedback signal in response to the output signal, wherein the output signal and reference signal have respective frequencies that relate to each other by a non-integer ratio having a value that depends on the frequency division ratio of a feedback divider in the feedback circuit; and the feedback circuit includes a feedback divider circuit configured and arranged with the correction and signal-drive circuit and the phase-frequency detection circuit as part of a fractional-PLL configured to dynamically change the frequency of the feedback signal by updating a division ratio of the feedback divider so that the ratio between the reference signal and the output signal appears as a fixed fractional ratio after integration.

15. An apparatus comprising:
a correction and signal-drive circuit configured and arranged to generate and correct an output signal, in terms of at least one of phase and frequency, relative to a reference signal having complementary differential signal components and in response to a direction indication signal, wherein the output signal has logic states which alternate in response to the reference signal for characterizing the frequency and phase;
a phase-frequency detection circuit including logic circuitry configured and arranged to respond to the reference signal and to a feedback signal by generating and updating the direction indication signal as a function of each of the logic states of an internal clock signal having risen and having fallen; and a feedback circuit configured and arranged to generate the feedback signal in response to the output signal, wherein the output signal and reference signal have respective frequencies that relate to each other by a non-integer ratio having a value that depends on the frequency division ratio of a feedback divider in the feedback circuit; and the feedback circuit includes a feedback divider circuit configured and arranged with the correction and signal-drive circuit and the phase-frequency detection circuit as part of a fractional-PLL configured to modulate one or both of the ratio of the feedback divider or an oscillator utilized in generating the output signal.

16. A method comprising:

in response to a direction indication signal, correcting an output signal in terms of at least one of phase and frequency relative to a reference signal having complementary differential signal components, wherein the output signal has logic states that alternate in response to the reference signal for characterizing the frequency and phase;

using logic circuitry configured and arranged as part of a phase-frequency detection circuit to respond to the reference signal and to a feedback signal by generating and updating the direction indication signal as a function of each of the logic states of an internal clock signal having risen and having fallen;

generating the complementary differential signal components of the reference signal, wherein the phase-frequency detection circuit generates and updates the direction indication signal in response to rising or falling edges of each of the differential signal components; and coupling, via a feedback circuit, the output signal to provide the feedback signal, wherein the feedback circuit includes a programmable divider.

17. The method of claim 16, wherein generating and updating the direction indication signal includes generating the direction indication signal based on edges of each of the complementary differential signal components that either falls or rises, further including updating the direction indication signal in response to each edge of the internal clock signal which either falls or rises.

18. The method of claim 16, further including providing phase detection and correction by detecting whether the reference signal lags or leads the output signal and, in response, by providing the direction indication signal.

19. The method of claim 16, wherein coupling the output signal to provide the feedback signal includes dividing the output signal to provide the feedback signal.

* * * * *